(12) United States Patent
Tsuji et al.

(10) Patent No.: US 8,410,532 B2
(45) Date of Patent: Apr. 2, 2013

(54) SOLID-STATE IMAGING DEVICE INCLUDING A MULTILAYER WIRING LAYER, COLOR FILTERS, LENSES, AND WAVEGUIDE GROOVE AND MANUFACTURING METHOD FOR THE SAME

(75) Inventors: Shoichiro Tsuji, Kyoto (JP); Kazuhiro Yamashita, Hyogo (JP)

(73) Assignee: Panasonic Corporaiton, Osaka (JP)

( * ) Notice: Subject to any disclaimer, the term of this patent is extended or adjusted under 35 U.S.C. 154(b) by 137 days.

(21) Appl. No.: 13/162,092

(22) Filed: Jun. 16, 2011

(65) Prior Publication Data
US 2011/0309460 A1  Dec. 22, 2011

(30) Foreign Application Priority Data
Jun. 17, 2010  (JP) .................... 2010-138353

(51) Int. Cl.
*H01L 31/62* (2011.01)

(52) U.S. Cl. ......... 257/291; 257/E27.132; 257/E27.133; 257/432; 257/440; 257/444; 257/428; 438/48; 438/57; 438/69; 438/70

(58) Field of Classification Search .................. 257/428, 257/440, 444–446; 438/70
See application file for complete search history.

(56) References Cited

U.S. PATENT DOCUMENTS 7,598,552 B2 * 10/2009 Park ............................ 257/291

| | | |
|---|---|---|
| 2006/0220073 A1 | 10/2006 | Kooriyama |
| 2009/0166783 A1 | 7/2009 | Maruyama |
| 2009/0189237 A1 | 7/2009 | Hirano |
| 2010/0140453 A1 * | 6/2010 | Kikuchi .................. 250/208.1 |
| 2010/0155582 A1 | 6/2010 | Hirano et al. |

FOREIGN PATENT DOCUMENTS

JP  2009-267062  11/2009

\* cited by examiner

*Primary Examiner* — Marcos D. Pizarro
*Assistant Examiner* — Cesar Lopez
(74) *Attorney, Agent, or Firm* — McDermott Will & Emery LLP (57) ABSTRACT

The present invention provides a solid-state imaging device comprising: a semiconductor substrate having a pixel region and a peripheral circuit region; a multilayer wiring layer including layers of wiring and an interlayer film interposed therebetween, and disposed above the semiconductor substrate to cover the pixel region and the peripheral circuit region except areas above the photoelectric conversion elements; a waveguide member filling the areas above the photoelectric conversion elements (waveguides) and covering the multilayer wiring layer at least within the pixel region; and an optical structure (composed of a color filter material and a lens material) disposed above the waveguide member within the pixel region, wherein a groove is formed by removing a portion of the waveguide member from an area within the pixel region that is in a border between the pixel region and the peripheral circuit region.

15 Claims, 13 Drawing Sheets

SOLID-STATE IMAGING DEVICE INCLUDING A MULTILAYER WIRING LAYER, COLOR FILTERS, LENSES, AND WAVEGUIDE GROOVE AND MANUFACTURING METHOD FOR THE SAME

The disclosure of Japanese Patent Application No. 2010-138353 filed Jun. 17, 2010 including specification, drawings and claims is incorporated herein by reference in its entirety.

BACKGROUND OF THE INVENTION (1) Technical Field

The present invention relates to a solid-state imaging device including a multilayer wiring layer, color filters, and lenses, and a manufacturing method for the same, and in particular to a technology for appropriately adjusting the thicknesses of color filters and lenses so as to suppress unevenness in the thicknesses thereof between pixels.

(2) Background Art

A solid-state imaging device, such as a CMOS image sensor and a CCD image sensor, is provided with a pixel region, in which a plurality of pixels are arranged in a matrix. In each of the pixels within the pixel region, a light receiver which outputs imaging signals in accordance with the amount of light incident thereto and an area corresponding to the light receiver which transmits imaging signals are disposed in one main surface of a semiconductor substrate. In addition, such a solid-state imaging device also includes a peripheral circuit region similarly provided on the main surface of the semiconductor substrate and which performs drive control of the pixel region and signal processing of the imaging signals.

There have been various proposals made throughout the years of technologies for enhancing the optical characteristics of such a solid-state imaging device. One example of such technology is the waveguide technology, which allows photodiodes in the solid-state imaging device to receive incident light with increased efficiency.

A waveguide consists of a core (a portion of a waveguide member) which functions as an optical path for incident light, and a cladding (an interlayer insulating film) which surrounds the core. By selecting an appropriate material for each of the core and the cladding, incident light entering the waveguide via the color filter and the lens is reflected at a boundary surface between the core and the cladding, and is received by the photodiode with only a minimal amount of light being lost.

However, concerning such solid-state imaging devices having the waveguide formed therein, there lies a problem in that a difference in terms of level, with respect to the main surface of a substrate on which the solid-state imaging device is formed, exists between the top surface of the pixel region and the top surface of the peripheral circuit region. Such difference in level results in an incline being formed on areas of the color filter film and the lens film when the color filter film and the lens film are successively disposed onto the top surfaces of the pixel region and the peripheral circuit region having the waveguide member disposed thereon. The forming of such an incline is problematic in that differences arise in the thicknesses and the shapes of the color filter film and the lens film within the pixel region. If the films have ununiform thicknesses and shapes within the pixel area, an ununiform amount of light is produced by pixels of the yielded solid-state imaging device. Furthermore, such unevenness in thicknesses and shapes of the films may lead to pixels of the solid-state imaging device having ununiform sensitivity levels, which further results in unevenness in terms of color and sensitivity.

Since such unevenness in color and sensitivity is caused by the unevenness in the amount of light produced by pixels as mentioned above, the same problems occur not only in solid-state imaging devices to which the waveguide technology has been applied, but in all conventional solid-state imaging devices.

With such problems in consideration, Patent Literature 1 discloses a structure for reducing the aforementioned level difference formed between the pixel region and the peripheral circuit region. In detail, Patent Literature 1 suggests reducing the aforementioned incline formed in a conventional solid-state imaging device by disposing a groove (a concave) in an insulating film disposed on the multilayer wiring layer within the pixel region, and applying a color filter material on the insulating film having the groove provided therein.

CITATION LIST

Patent Literature

[Patent Literature 1] Japanese Patent Application Publication No. 2009-267062

SUMMARY OF THE INVENTION

Technical Problem

However, when applying the structure of Patent Literature 1, the depth of the groove formed in the interlayer insulating film is decreased to a certain extent, or completely, by the waveguide material applied thereto for forming a waveguide member. Therefore, the groove will lose the effect of appropriately adjusting the film thickness and the shape of the color filter to be formed thereon to a certain extent or completely. Further, since the groove similarly loses the effect of appropriately adjusting the film thickness and the shape of the lens film, the problem of pixels having ununiform sensitivity levels remains unsolved.

Further, when forming the groove as disclosed in Patent Literature 1 in the multilayer wiring layer, it is essential that the groove be formed in the multilayer wiring layer so as not to come in contact with the wiring interposed in the multilayer wiring layer. As such, it is required that the groove be formed higher in level than the wiring, or that a buffer area be formed in the multilayer wiring layer in which wiring is not disposed. Unless such configurations are made, the effect provided to the groove of flattening the surface of the color filter film will be diminished. However, such configurations cannot be made without producing negative effects at the same time. For instance, when the groove is formed higher in level in the multilayer wiring layer with respect to the main surface of the substrate, the distance between the photodiodes and the top surface of the multilayer wiring layer is extended accordingly. This leads to a reduction in the sensitivity of the imaging device, as well as a reduction in yield ratio which is caused by the generation of noises corrupting the imaging signals. Additionally, the provision of the buffer area leads to such problems as an undesired enlargement of chip area, which is also problematic.

In view of such problems, the present invention aims to reduce or eliminate such defects found in solid-state imaging devices when color filters and lenses are formed therein by making appropriate arrangements to the shape of the waveguide member.

In addition, another aim of the present invention is to provide an efficient manufacturing method for such a solid-state imaging device.

Solution to Problems

In order to solve the aforementioned problems, the present invention has the following aspects.

One aspect of the present invention is a solid-state imaging device including, as the main components thereof, a semiconductor substrate, a multilayer wiring layer, a waveguide material, and an optical structure.

The semiconductor substrate has a pixel region and a peripheral circuit region, the peripheral circuit region being in a periphery of the pixel region and configured to perform drive control of the pixel region and imaging signal processing, a plurality of unit pixels, each including a photoelectric conversion element and a gate element, being disposed in a two-dimensional array within the pixel region.

The multilayer wiring layer includes layers of wiring and an interlayer film interposed therebetween, and is disposed above the semiconductor substrate to cover the pixel region and the peripheral circuit region except areas above the photoelectric conversion elements.

The waveguide member fills the areas above the photoelectric conversion elements and covers the multilayer wiring layer at least within the pixel region such that, in each of the areas above the photoelectric conversion elements, a waveguide is formed by the waveguide member and the interlayer film, the waveguide being an optical path for guiding incident light therethrough to the corresponding photoelectric conversion element.

The optical structure is composed of a color filter material and a lens material and is disposed above the waveguide member within the pixel region.

Further, in the solid state imaging device, a groove is formed by a portion of the waveguide member covering the multilayer wiring layer being removed from an area within the pixel region along a border between the pixel region and the peripheral circuit region.

According to the above structure of the solid-state imaging device which is one aspect of the present invention, the groove is formed in at least one of the pixel region and the peripheral circuit region by removing a portion of the waveguide member therefrom. Hence, the color filter material and the lens material are each formed to have a desired level of flatness.

A second aspect of the present invention is a manufacturing method for a solid-state imaging device, the manufacturing method comprising the following steps (i) through (v).

(i) A first step of providing a pixel region and a peripheral circuit region on a semiconductor substrate, the pixel region including a plurality of unit pixels, each including a photoelectric conversion element and a gate element, and disposed in a two-dimensional array, the peripheral circuit region provided in a periphery of the pixel region and configured to perform drive control of the pixel region and imaging signal processing.

(ii) A second step of disposing, above the semiconductor element, a multilayer wiring layer including layers of wiring and an interlayer film interposed therebetween, so as to cover the pixel region and the peripheral circuit region except areas above the photoelectric conversion elements.

(iii) A third step of disposing a waveguide member to fill the areas above the photoelectric conversion elements and to cover the multilayer wiring layer at least within the pixel region such that, in each of the areas above the photoelectric conversion elements, a waveguide is formed by the waveguide member and the interlayer film, the waveguide being an optical path for guiding incident light therethrough to a corresponding photoelectric conversion element.

(iv) A fourth step of forming an optical structure that is composed of a color filter material and a lens material above the waveguide member within the pixel region.

(v) A step of forming a groove by removing a portion of the waveguide member covering the multilayer wiring layer from an area within the pixel region along a border between the pixel region and the peripheral circuit region, the groove forming step performed concurrently with or subsequent to the third step, and prior to the fourth step.

In the manufacturing method for a solid-state imaging device which is the second aspect of the present invention, the groove is formed by removing a portion of the waveguide material. Owing to this, the optical structure formed in the subsequent step is formed to have a flat surface within the pixel region. In consequence, a manufacturing method is provided for a solid-state imaging device which is capable of providing images with reduced levels of color unevenness and sensitivity unevenness, by the unevenness in sensitivity level among unit pixels being reduced.

Advantageous Effects of the Invention

The present invention provides a solid-state imaging device having a reduced level of unevenness in terms of color and sensitivity compared with conventional solid-state imaging devices. Further, the present invention does not require disposing a groove in the multilayer wiring layer in which wiring is disposed. Thus, no restrictions are imposed in terms of location in the arrangement of wiring, and also the width of the buffer area in which the groove is disposed is reduced. And consequently, the present invention also has the advantageous effect of reducing chip area.

BRIEF DESCRIPTION OF THE DRAWINGS

These and other objects, advantages and features of the present invention will become apparent from the following description thereof taken in conjunction with the accompanying drawings which illustrate a specific embodiment of the invention.

In the drawings.

DESCRIPTION OF THE EMBODIMENT

In the following, detailed description is made on an embodiment pertaining to the present invention, with reference to the accompanying drawings. The following description of the preferred embodiment of the invention with reference to the attached drawings has been presented for the purposes of illustration and description. It is not intended to be exhaustive or to limit the invention to the precise form disclosed.

Embodiment

Figure 1:
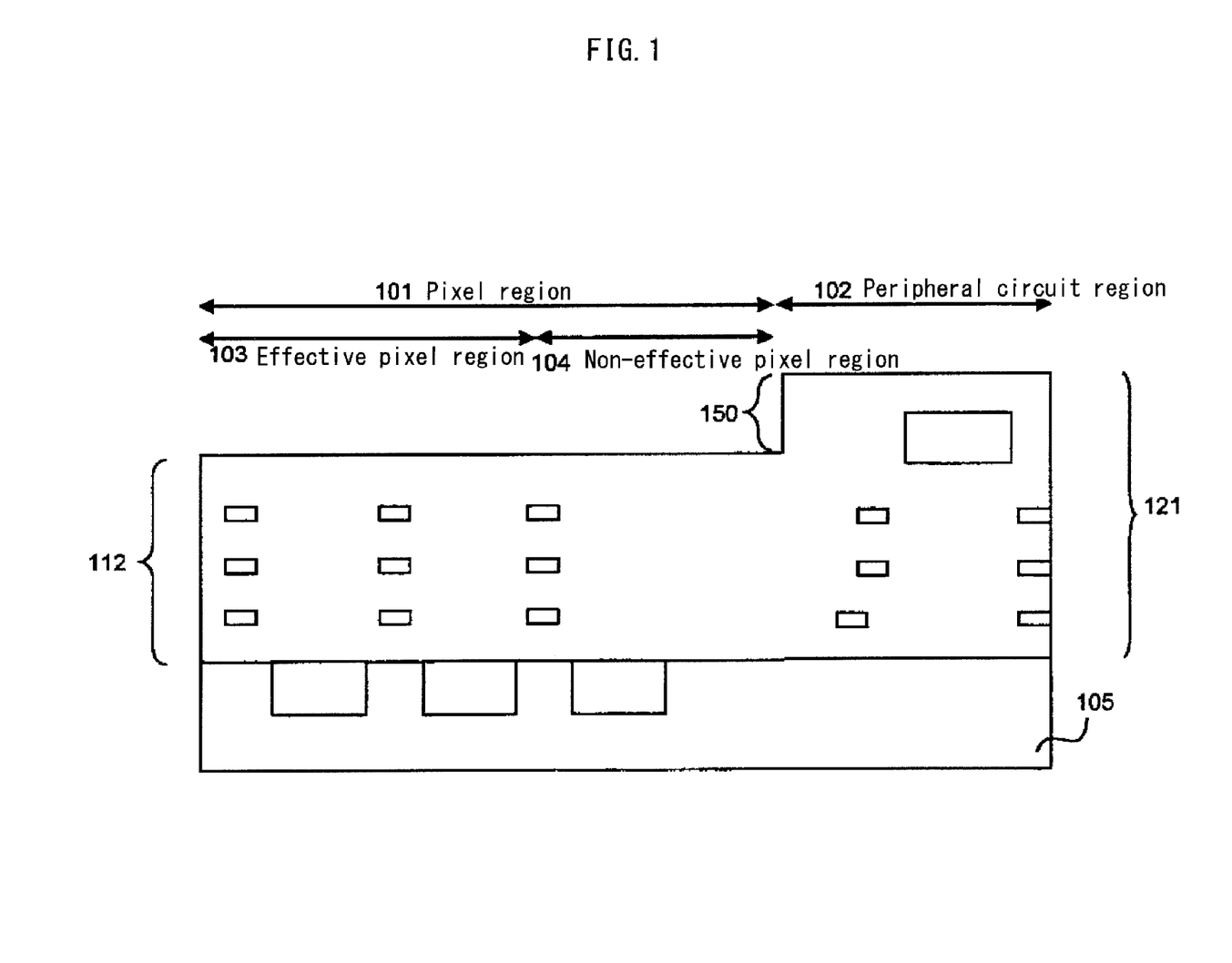
FIG. 1 is a cross-sectional view showing the structure of a pixel region and a peripheral circuit region, prior to a step of forming waveguides which is one step included in the manufacturing procedures of a solid-state imaging device pertaining to the embodiment.

FIG. 1 is a cross-sectional view taken along a plane perpendicular to a main surface of a substrate on which a solid-state imaging device pertaining to the embodiment is formed. FIG. 1 illustrates the structure of a pixel region and a peripheral circuit region, prior to a step of forming waveguides which is one step included in the manufacturing procedures of the solid-state imaging device.

A pixel region 101 is provided on a silicon substrate 105. The pixel region 101 of the imaging device includes a plurality of unit pixels which are arranged in a two-dimensional array. Each of the unit pixels includes a photoelectric conversion element and a gate element (a transistor element, for example). The pixel region 101 is further divided into an effective pixel region 103 and a non-effective pixel region 104. The effective pixel region 103 is a region of the pixel region 101 which actually outputs imaging signals, while the non-effective pixel region 104 is a region of the pixel region 101 which does not actually output imaging signals. Further, a peripheral circuit region 102 is provided in a periphery of the pixel region 101. The peripheral circuit region 102 performs drive control of the pixel region 101 and signal processing of imaging signals.

As is illustrated in FIG. 1, a level difference 150 is formed between the pixel region 101 and the peripheral circuit region 102. The level difference 150 is formed since a multilayer wiring layer 112 within the pixel region 101 is lower in terms of level with respect to the surface of the silicon substrate 105 compared to a multilayer wiring layer 121 within the peripheral circuit region 102. In length, the level difference 150 ranges approximately between 100 nm and 3 μm.

Figure 2:
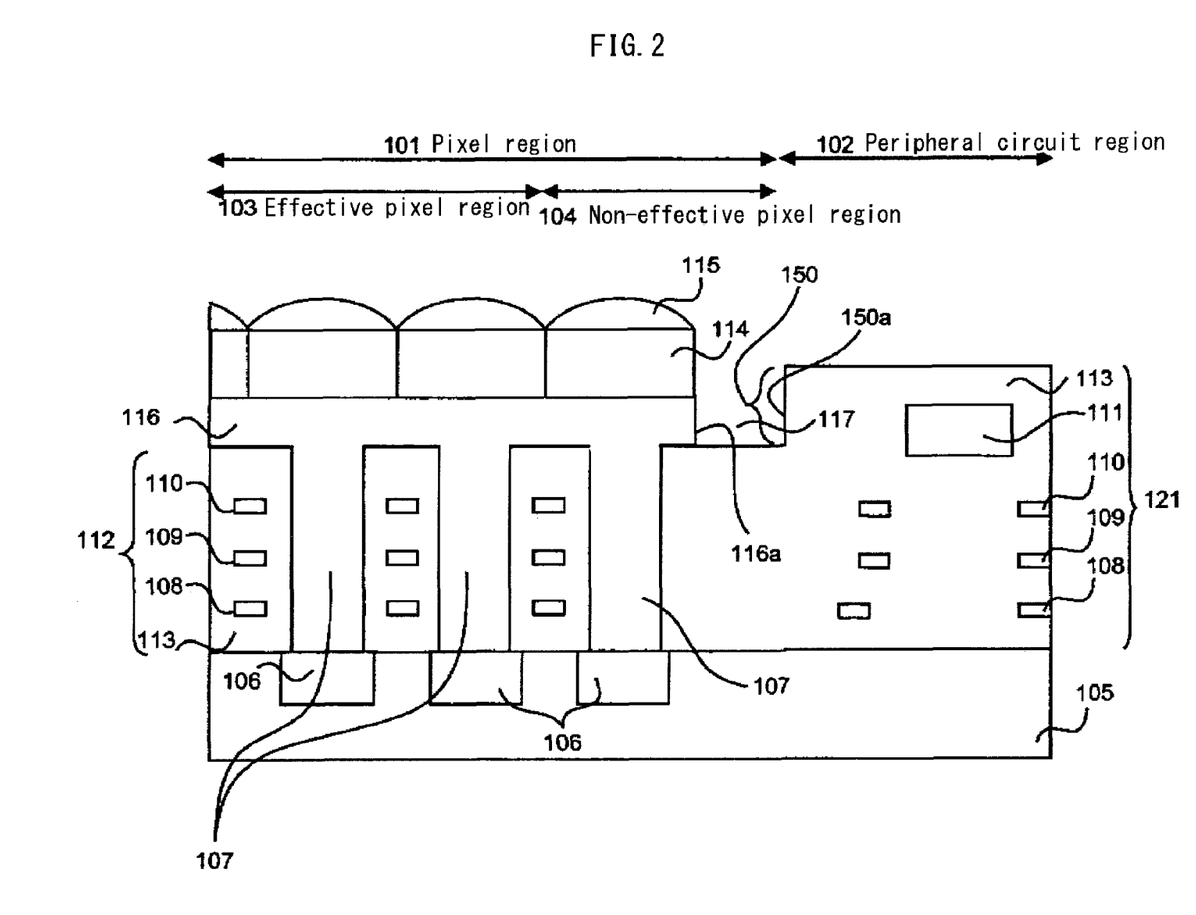
FIG. 2 is a cross-sectional view showing an example of the structure of the solid-state imaging device pertaining to the embodiment.

FIG. 2 illustrates a schematic cross-sectional structure of the solid-state imaging device pertaining to the embodiment of the present invention.

As is illustrated in FIG. 2, photodiodes 106 are disposed in the silicon substrate 105 within the pixel region 101, and further, waveguides 107 are formed within the pixel region 101. The waveguides 107 include portions of a waveguide member 116. Each of the waveguides 107 is located above a corresponding one of the photodiodes 106, and propagates light. In detail, each of the waveguides 107 is composed of a core and a cladding. A portion of the waveguide member 116 disposed above each of the photodiodes 106 corresponds to the core of the waveguide 107, and an interlayer film 113 included in the multilayer wiring layer 112 corresponds to the cladding of the waveguide 107.

Within the pixel region 101, the waveguide member 116, a color filter 114, and an lens 115 are formed above the multilayer wiring layer 112. The multilayer wiring layer 112 includes wirings 108, 109, and 110, and the interlayer film 113 which is interposed between the wirings 108, 109, and 110.

Within the peripheral circuit region 102, the multilayer wiring layer 121 is disposed. The multilayer wiring layer 121 includes wirings 108, 109, 110, 111, and the interlayer film 113 interposed therebetween.

As is illustrated in FIG. 2, the waveguide member 116 not only includes the portions composing the waveguides 107, but also includes portions disposed on the portions composing the waveguides 107, portions on the multilayer wiring layer 112, and an end portion having a side wall 116a. The side wall 116a of the waveguide member 116 faces a side wall 150a forming the level difference 150. The level difference 150 is formed at a border between the pixel region 101 and the peripheral circuit region 102. Further, a groove 117 is formed by the side wall 150a, the side wall 116a, and an area lying therebetween.

Figure 13:
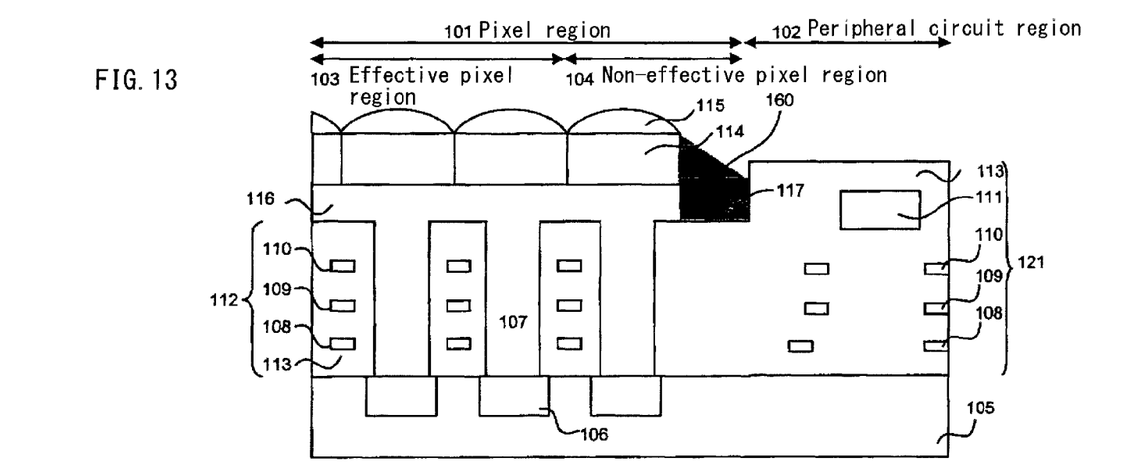
FIG. 13 is a cross-sectional view showing one step in the manufacturing method of the solid-state imaging device pertaining to the embodiment.

The provision of the groove 117 as described in the above has a positive effect when a color filter film 114 is formed on the waveguide member 116. To form the color filter film 114 on the waveguide member 116, a color filter film material is applied onto the waveguide member 116. Here, when an excessive amount of color filter film material is applied to form the color filter film 114, the excessive color filter film material fills the groove 117, as depicted in FIG. 13 by the symbol 160. Therefore, even in a case where the color filter film material is excessively applied to an area extending across the groove 117 forming the level difference 150, the excessive color filter film material fills the groove 117, thereby reducing the negative effect caused by the level difference 150 to a great extent.

Figure 9:
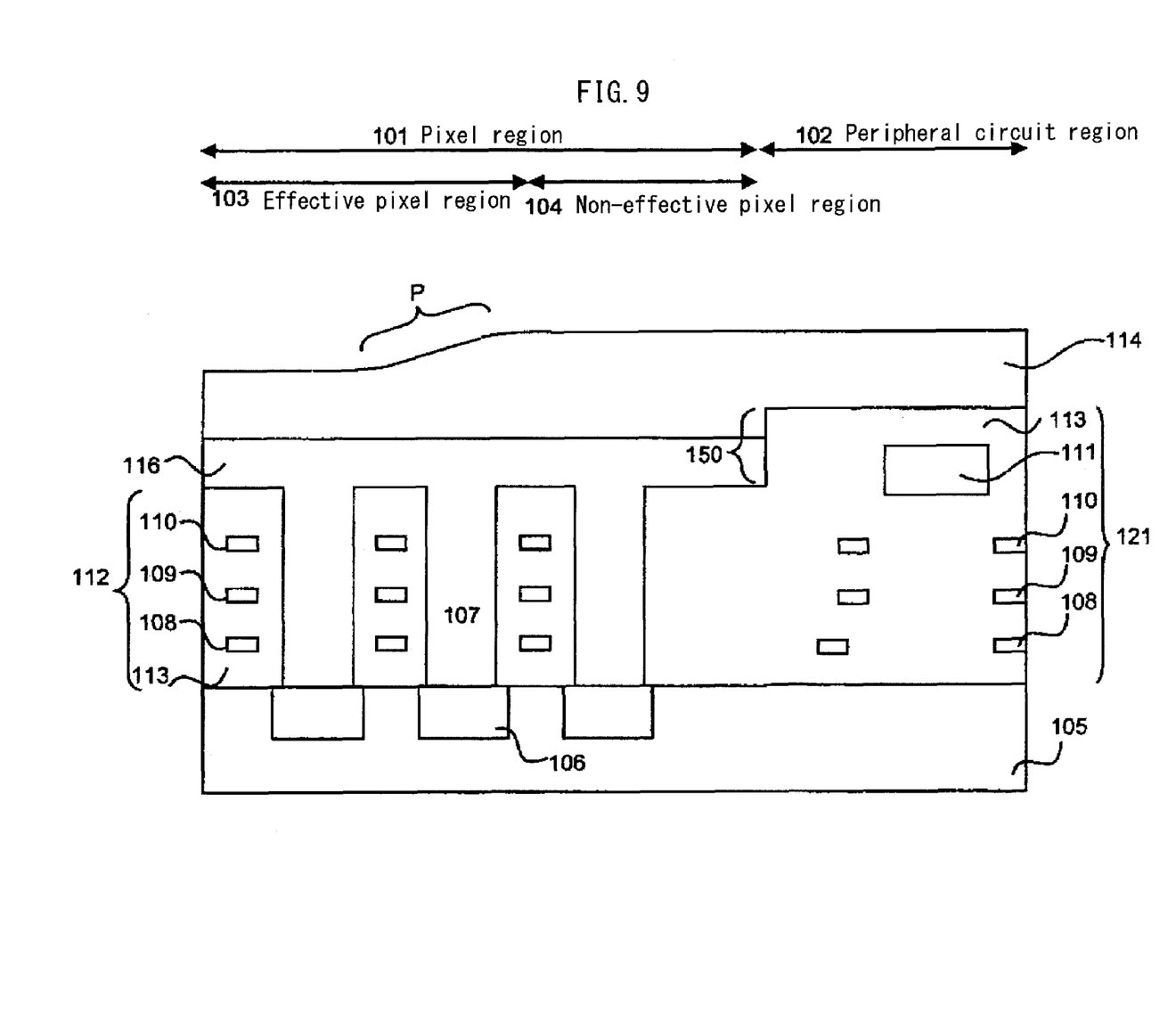
FIG. 9 is a cross-sectional view showing one step in the manufacturing method of a conventional solid-state imaging device which does not have a groove formed therein.

In contrast, in a conventional solid-state imaging device in which the groove 117 is not formed, when the color filter film material is applied to form the color filter film 114, the color filter film material is affected by the level difference 150. Specifically, an inclined area P is formed as depicted in FIG. 9. Further, as a result of the inclined area P being formed, the thickness of the color filter film 114 differs among pixels. In detail, the thickness of the color filter film 114 is thicker in an area thereof which is closer to the peripheral circuit region 102 than in an area thereof which is closer to the center of the effective pixel region 103. This unevenness in thickness gives rise to problems such as pixels of the solid-state imaging device having different levels of sensitivity. However, by forming the groove 117 as described in the present embodiment, the excessive color filter film material fills the groove 117 and, in consequence, the negative effect that the level difference 150 has on the color filter film material is eliminated, thereby resolving the problems found in the conventional solid-state imaging device.

<Manufacturing Method of the Solid-State Imaging Device Pertaining to the Embodiment>

In the following, description is made on the manufacturing method for the solid-state imaging device as illustrated in FIG. 2, with reference to FIGS. 3 through 12. Note that, since the term "solid-state imaging device" denotes a final product yielded as a result of carrying out all steps included in the manufacturing method for the solid-state imaging device, an incomplete product which is still in the midst of manufacturing cannot be referred to with the use of the term. Therefore, in the present specification, the incomplete product in the midst of the manufacturing procedures is referred to using the term "device pre-product".

Figure 3:
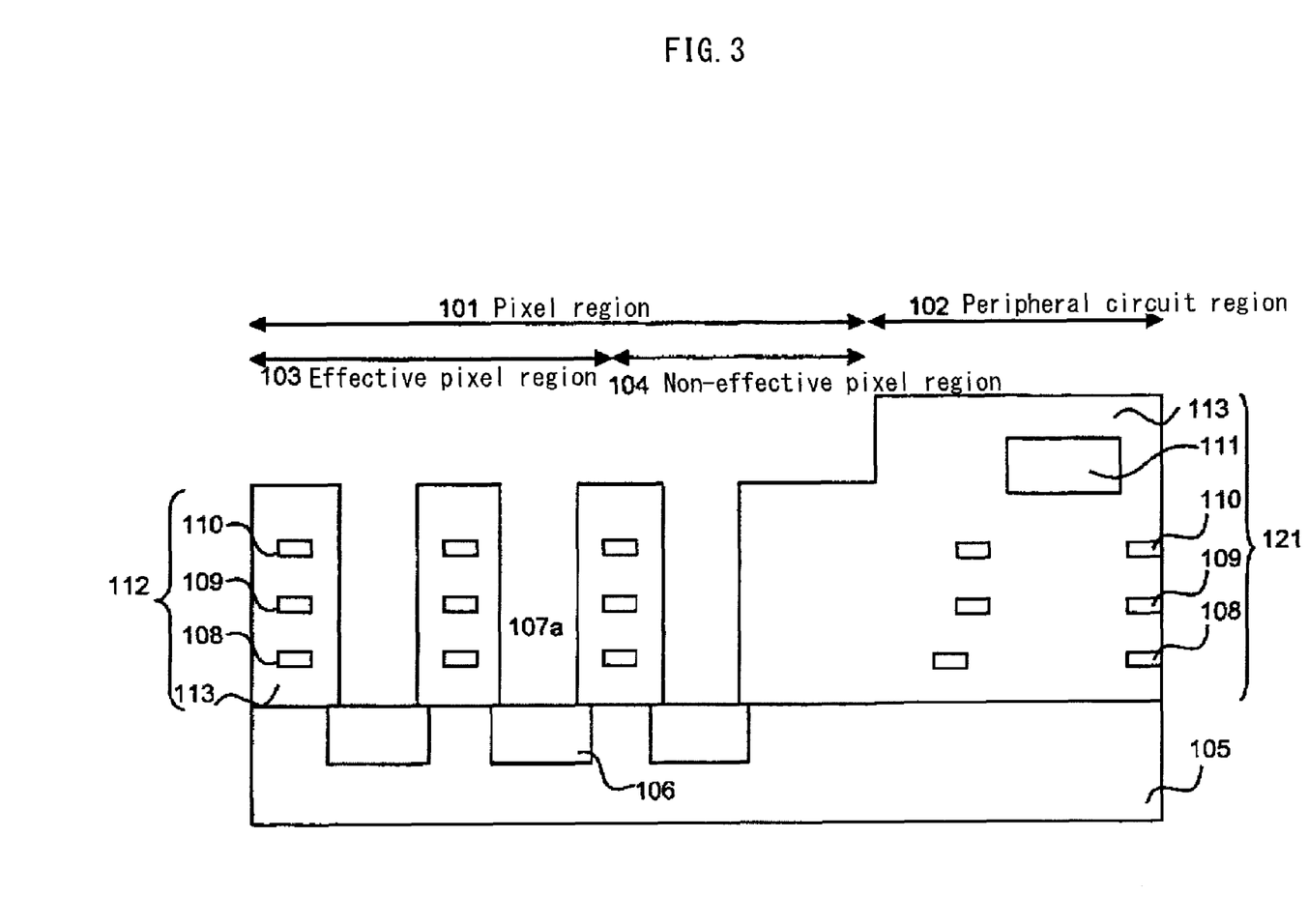
FIG. 3 is a cross-sectional view showing one step in the manufacturing method of the solid-state imaging device pertaining to the embodiment.

FIG. 3 is a cross-sectional view showing a section of the device pre-product at a point before a groove forming step. The device pre-product includes the silicon substrate 105, the photodiodes 106, the multilayer wiring layer 112, the multilayer wiring layer 121, and a concave portion 107a for forming the waveguide, all of which are disposed on the silicon substrate 105 and formed in the pixel region 101 or the peripheral circuit region 102.

Figure 4:
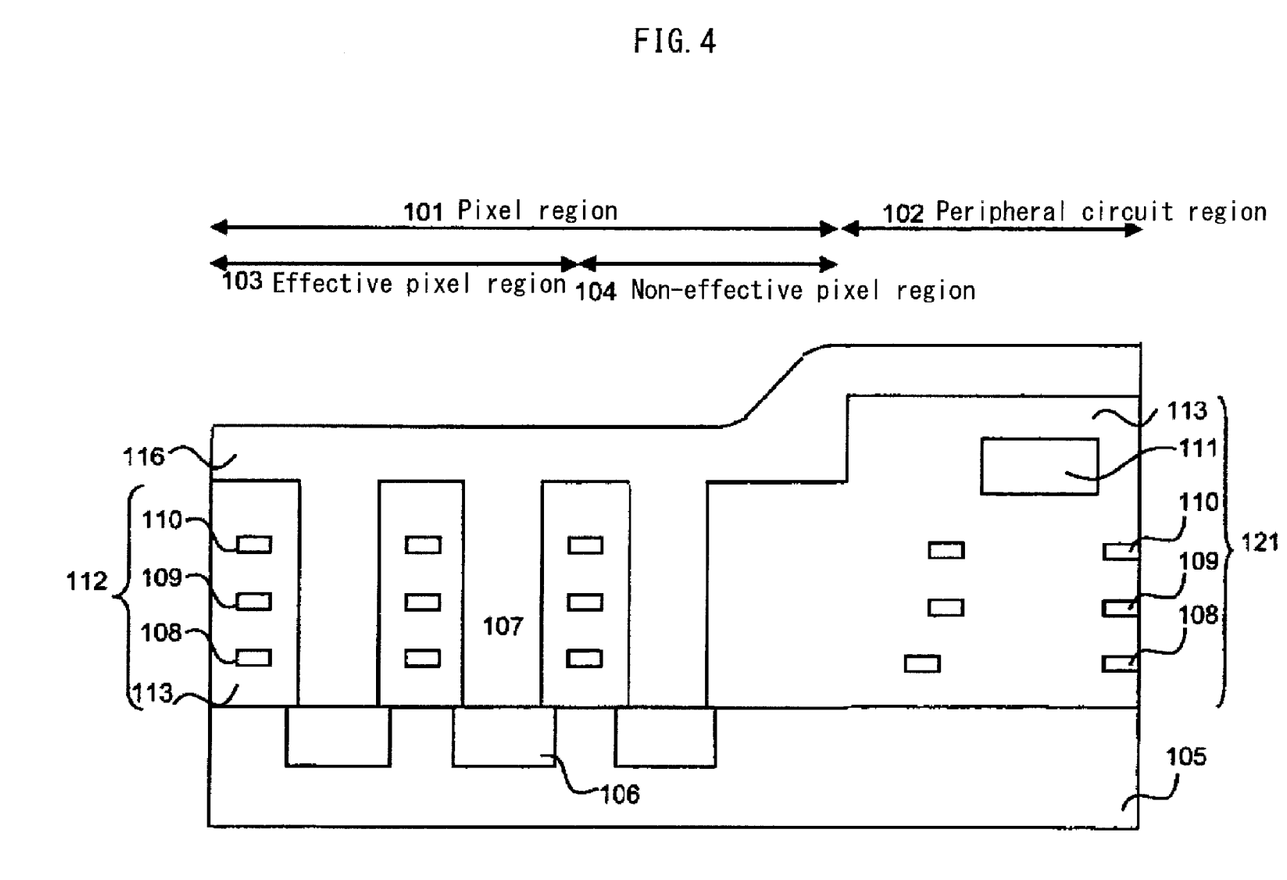
FIG. 4 is a cross-sectional view showing one step in the manufacturing method of the solid-state imaging device pertaining to the embodiment.

At this stage, a material for forming the waveguide member 116 is spin-coated onto the device pre-product as illustrated in FIG. 4, and thus a film covering the pixel region 101 and the peripheral circuit region 102 is formed.

Figure 5:
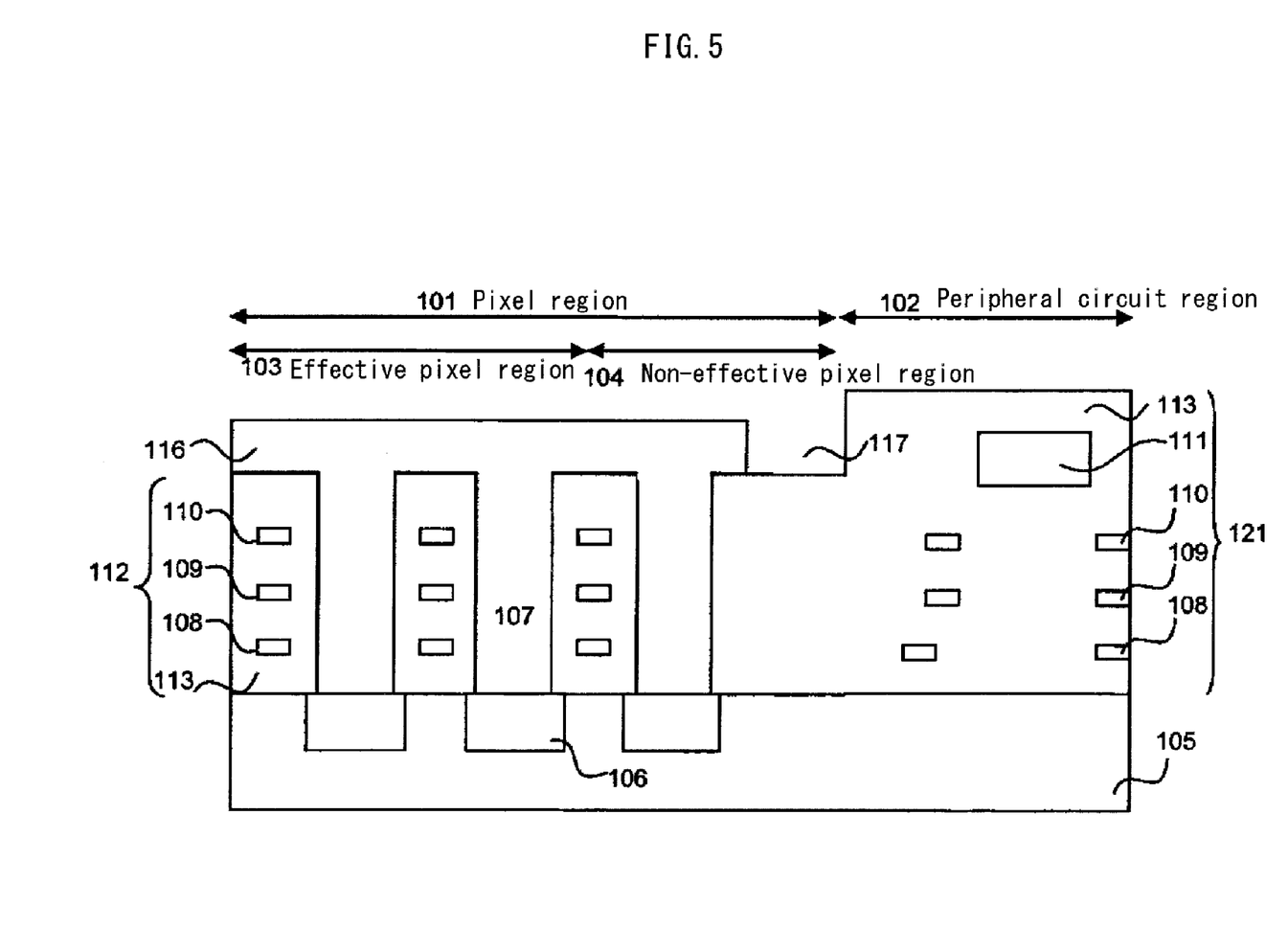
FIG. 5 is a cross-sectional view showing one step in the manufacturing method of the solid-state imaging device pertaining to the embodiment.

Following this, the groove 117 is formed by removing a portion of the film which has been formed over the pixel region 101 and the peripheral circuit region 102, as illustrated in FIG. 5. More specifically, a portion of the film of the waveguide material is removed from within the non-effective pixel region 104 of the pixel region 101.

Here, the material for forming the film of waveguide material is, for instance, a positive photosensitive resin which is soluble in alkaline developing solutions.

Here, description is made under the presumption that the positive photosensitive resin contains a medium of a polymeric resin containing at least one of C and Si, and the refractive index of the polymeric resin is greater than or equal to 1.5. When forming the waveguide member using positive photosensitive resin having such characteristics, and further when the cladding of the waveguide is composed of $SiO_2$, a critical angle with which the incident light undergoes total internal reflection at a boundary surface between the core (a portion of the waveguide member) and the cladding of the waveguide is subject to be smaller than the desired angle. Thus, incident light from an oblique direction is reflected with a reduced level of reflection efficiency. In consideration of the above, it is desirable that the polymeric resin be a polysiloxane resin, a polyimide resin or the like having refractive indices higher than 1.6.

In addition to the above, it is desirable that the material for forming the waveguide film is a material whose main component is an oxide of a group 4 element of the periodic table and which contains particles within the range of 1 nm and 100 nm in size. The measurement of particle size may be conducted applying the dynamic light scattering method.

For example, when the material for forming the waveguide film contains titanium oxide particles, and further contains a polyimide resin as a positive photosensitive resin, the material yields a highly refractive, highly transparent waveguide with a refractive index equal to or higher than 1.7, a transparency of equal to or higher than 90%, and a viscosity of between 1 cp and 50 cp. In addition, there is no reduction in terms of reflective efficiency of incident light from an oblique direction when the waveguide is formed using such a material. Furthermore, the yielded waveguide has a high quantum yield with respect to light.

Further, when the material for forming the film of waveguide material contains a photosensitive agent such as diazonaphthoquinone, the waveguide formed has a photosensitive property and is soluble in alkaline developing solutions. Thus, pattern formation with use of a mask pattern is facilitated.

Concerning the patterning to be performed, there is a common need of removing the film (the film for forming the waveguide member 116) from certain areas of the solid-state imaging device. Thus, for the sake of reducing the number of required steps in the manufacturing process, it is desirable that the groove 117 be formed at the same time as patterning the above-described film for forming the photosensitive waveguide member 116, rather than performing patterning against the area in which the groove 117 is to be formed as a separate step. Such areas from which the film needs to be removed include an area on which wire-bonding is to be performed.

In the forming of the film for the waveguide member 116, the groove 117 is formed in the non-effective pixel region 104 of the pixel region 101 such that the groove 117 has a width of 5 nm to 100 μm and a depth of 5 nm to 10 μm. It is further desirable that the width of the groove 117 be within a range of 1 μm and 25 μm. Providing a groove in such a manner exhibits the advantageous effects of reducing unevenness in sensitivity and reducing chip area.

For instance, when (i) the width of the groove 117 is between 1 μm and 25 μm, (ii) the level difference 150 between the multilayer wiring layer 112 of the pixel region 101 and the multilayer wiring layer 121 of the peripheral circuit region 102 is between 100 nm and 3 μm, and (iii) the film thickness of the waveguide member 116 measured from the top end surface of the multilayer wiring layer 112 is between 100 nm and 2.9 μm, the unevenness in sensitivity is substantially reduced. More specifically, the area of the solid-state imaging device in which sensitivity unevenness is reduced by 0.1% to 5% increases by 1 μm to 70 μm, towards the effective pixel region from the side wall 116a of the groove 117.

Figure 6:
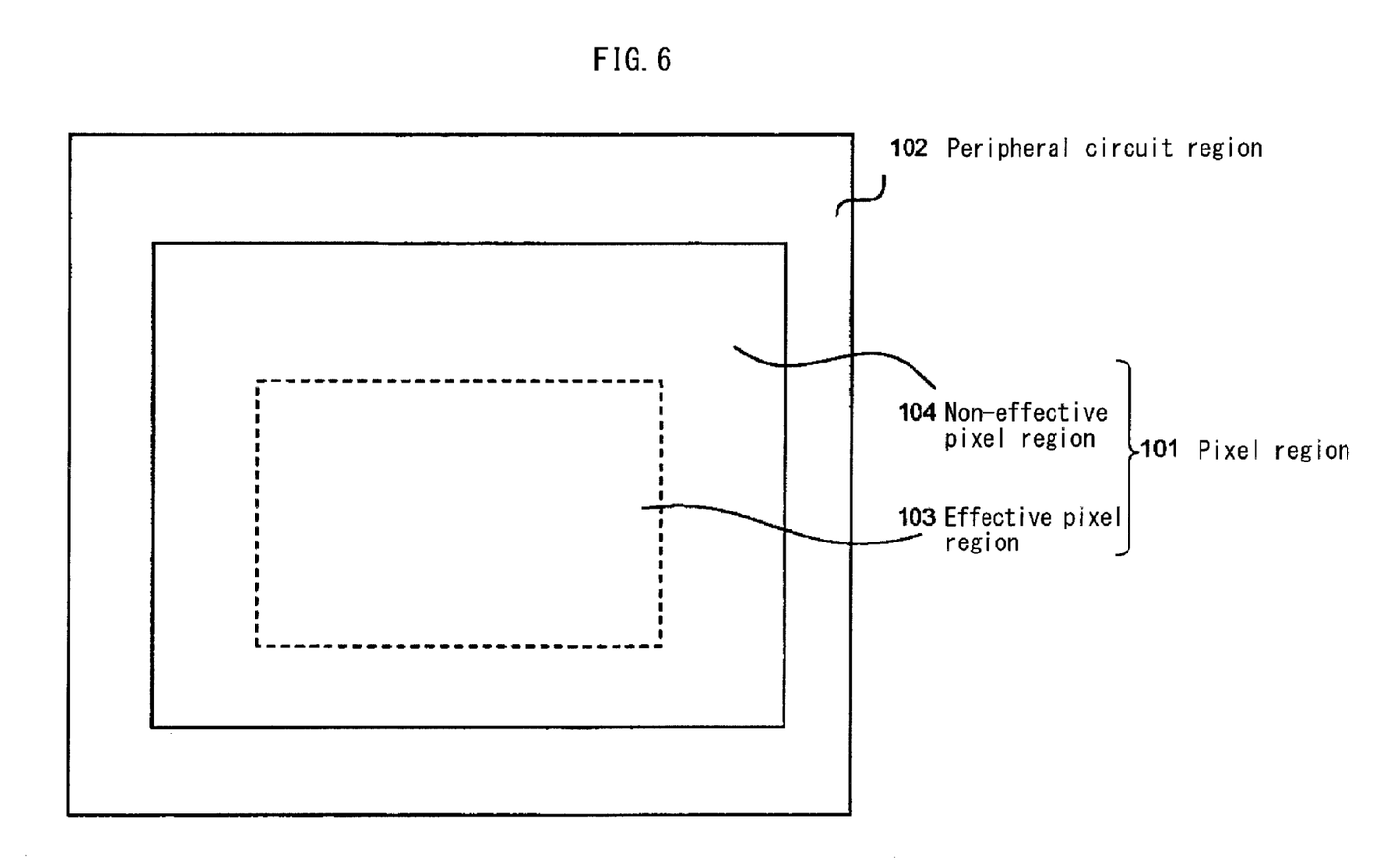
FIG. 6 is a top plan view showing one step in the manufacturing method of the solid-state imaging device pertaining to the embodiment.
Figure 7:
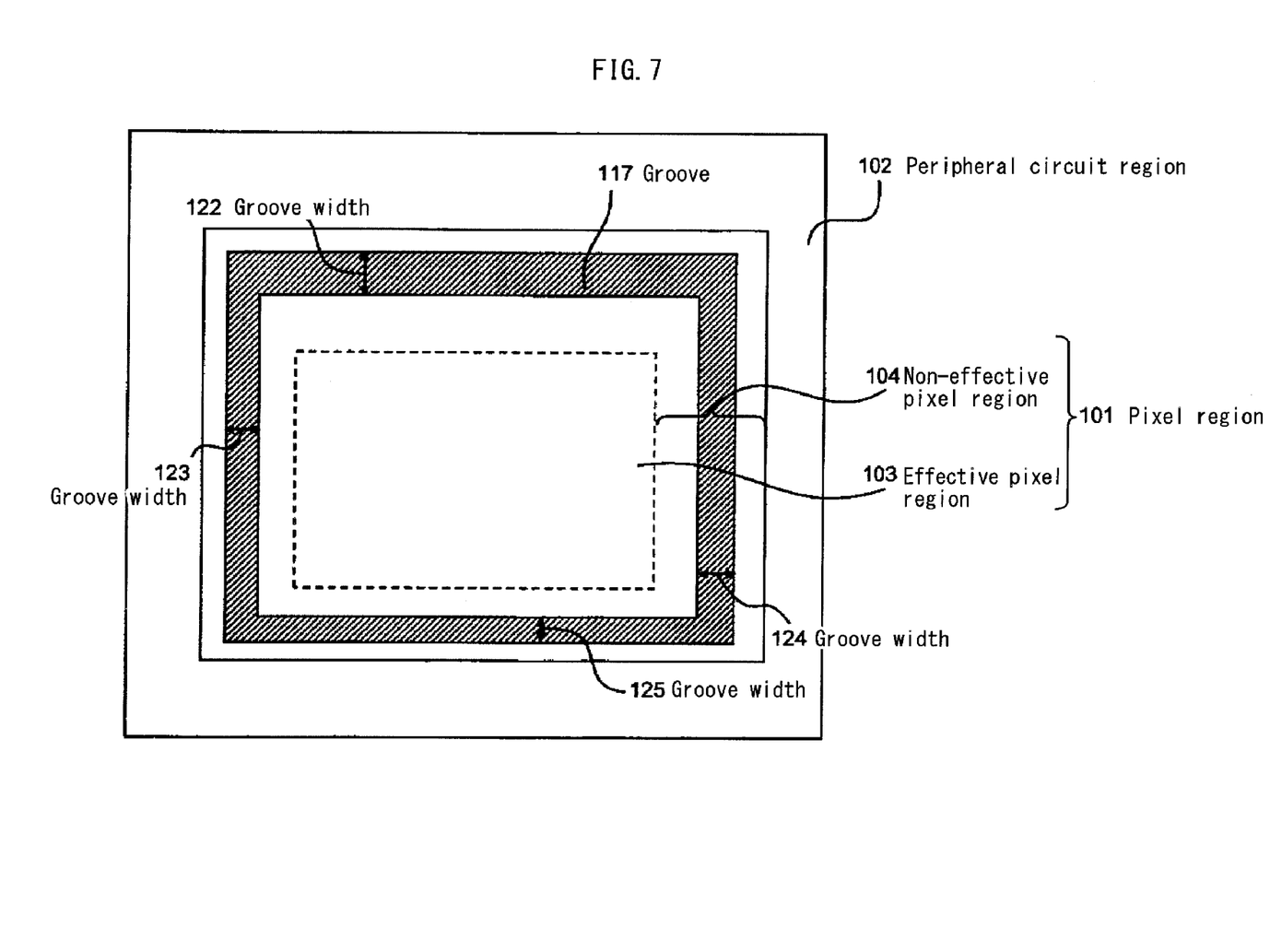
FIG. 7 is a top plan view showing one step in the manufacturing method of the solid-state imaging device pertaining to the embodiment.

Further, the width and position of the groove 117 in plan view may be set flexibly in relation to the four sides of the pixel region 101. FIG. 6 is a plan view taken along a plane parallel to the main surface of the substrate which illustrates one example of a form of the solid-state imaging device pertaining to the present embodiment. For instance, when forming the groove 117 in the solid-state imaging device as illustrated in FIG. 6, the width of the groove at each of points 122, 123, 124, and 125 which correspond to each of the four sides of the pixel region 101 may be individually set. More specifically, and as illustrated in FIG. 7, the width of the groove may be set in accordance with the width of a corresponding side of the non-effective pixel region 104. By making such a configuration, sensitivity unevenness and color unevenness of the solid-state imaging device is reduced even in cases where the width of the non-effective pixel region 104 differs at four sides thereof.

Note that the groove 117 may be disposed at any position within the non-effective pixel region 104. However, it is desirable that the groove 117 be disposed so that the outer edge thereof in top plan view coincides with the boundary between the peripheral circuit region 102 and the non-effective pixel region 104 so as to reduce chip size.

Figure 8:
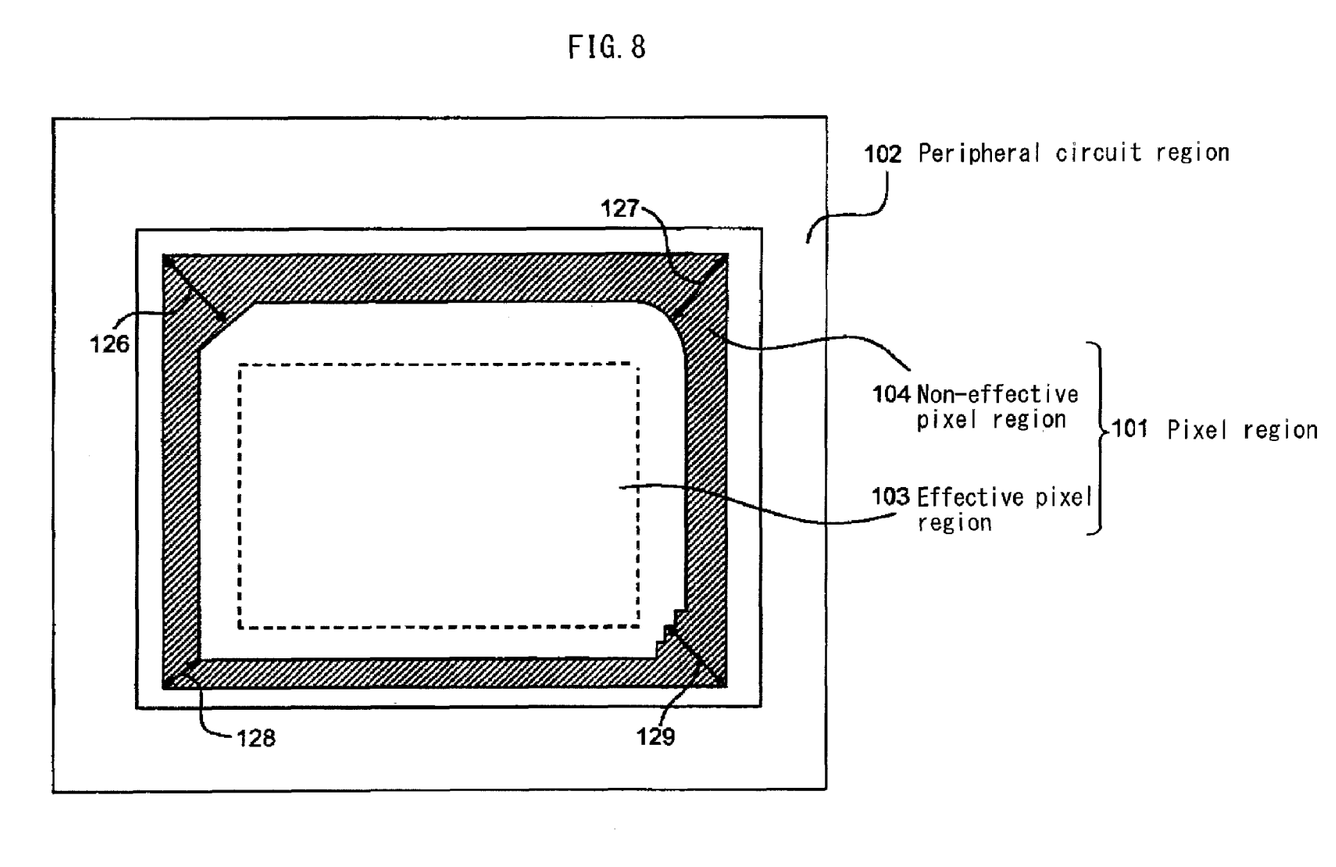
FIG. 8 is a top plan view showing one step in the manufacturing method of the solid-state imaging device pertaining to the embodiment.

Further, the groove 117 may be disposed such that the side wall 116a thereof at portions 126 through 129, which coincide with the four corners of the pixel region 101, are shaped to form an oblique line, a circular arc, a right angle, or a staircase form in plan view as depicted in FIG. 8. Further, similar as in the above case, the width of the groove 117 at each of the portions 126 through 129 thereof may be determined as desired.

In the following, description is made on a method for forming the color filter film, with reference to the accompanying FIGS. 9 through 11.

FIG. 9 illustrates an example of a conventional solid-state imaging device in which the groove 117 is not formed. FIG. 9 is a cross-sectional view taken along the main surface of the silicon substrate 105. In FIG. 9, the color filter film 114 has been formed on the waveguide member 116 by applying a color filter film material. However, in this case, since there exists a level difference 150 between the waveguide member 116 within the pixel region 101 and the multilayer wiring layer 112 of the peripheral circuit region 102, an unevenness is formed in the thickness of the color filter film 114 within the pixel region 101, as description has already been made in the above.

Figure 10:
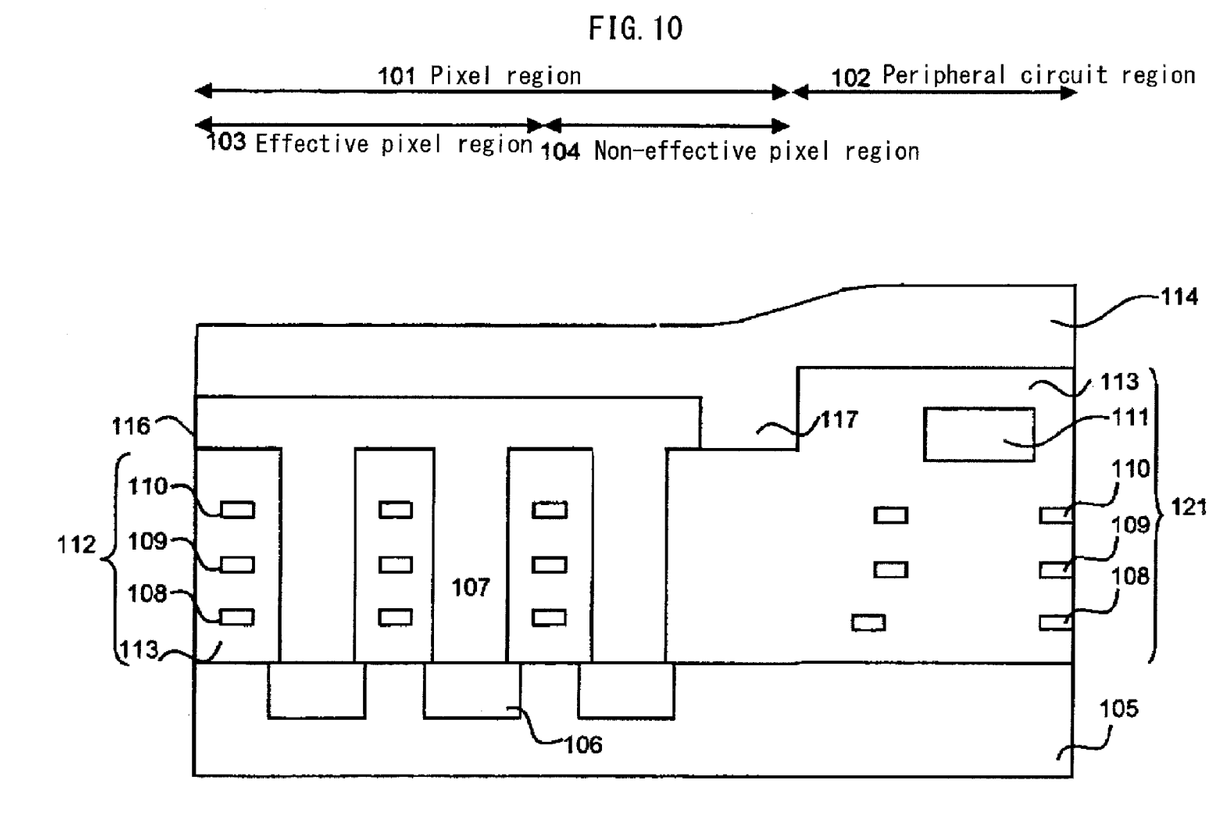
FIG. 10 is a cross-sectional view showing one step in the manufacturing method of the solid-state imaging device pertaining to the embodiment.
Figure 11:
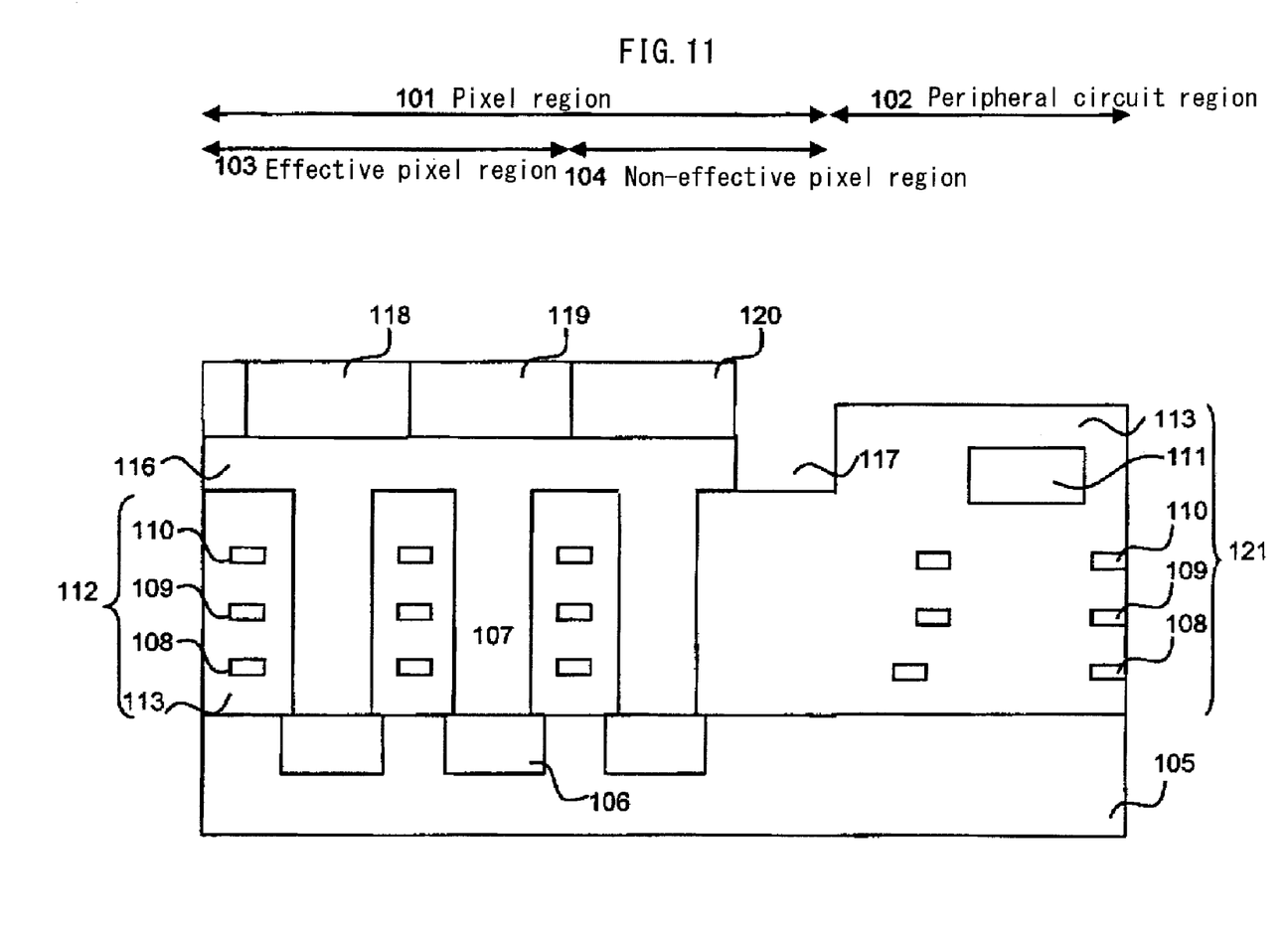
FIG. 11 is a cross-sectional view showing one step in the manufacturing method of the solid-state imaging device pertaining to the embodiment.

On the other hand, when forming the color filter film 114 on the waveguide member 116 having the groove 117 formed therein, the excessive color filter film material fills the groove 117 and the effect thereof is absorbed as illustrated in FIG. 10. Therefore, the difference in thickness of the color filter film 114 within the effective pixel region 103 is restricted to be smaller than in the case where the groove 117 is not formed as illustrated in FIG. 9. Thus, the unevenness in sensitivity among pixels is reduced.

Further, by using a material having high viscosity to form the color filter, the effect that the groove 117 exhibits of uniforming the thickness of the color filter film is enhanced. According to experimentation by the inventors, when a material with a viscosity of between 10 cp to 50 cp was used to form the color filter film, the thickness of the color filter film was reduced by 1 nm to 50 nm in a 70 μm portion from the cross-sectional side of the groove 117 closer to the effective pixel region 103, regardless of the order in which the processing of the color filter film 114 was performed.

In addition, the color filter film 114 may be formed separately for each color in units of pixels by performing application of the color filter film material, exposure, and development. FIG. 11 is a cross-sectional view of the solid-state imaging device after a pattern has been formed thereon. In FIG. 11, the symbols 118, 119, and 120 each indicate a color filter, and each of the pixels may be provided with a color filter of an appropriate color. For example, the color filter indicated by the symbol 118 may be a green color filter, the color filter indicated by the symbol 119 may be a blue color filter, and the color filter indicated by the symbol 120 may be a red color filter. Note that such examples have been provided for the mere sake of explanation that the colors of the color filters may be arranged in units of pixels, and there is no intention of limiting the location in which a color filter of a specific color is provided to a specific location.

Figure 12:
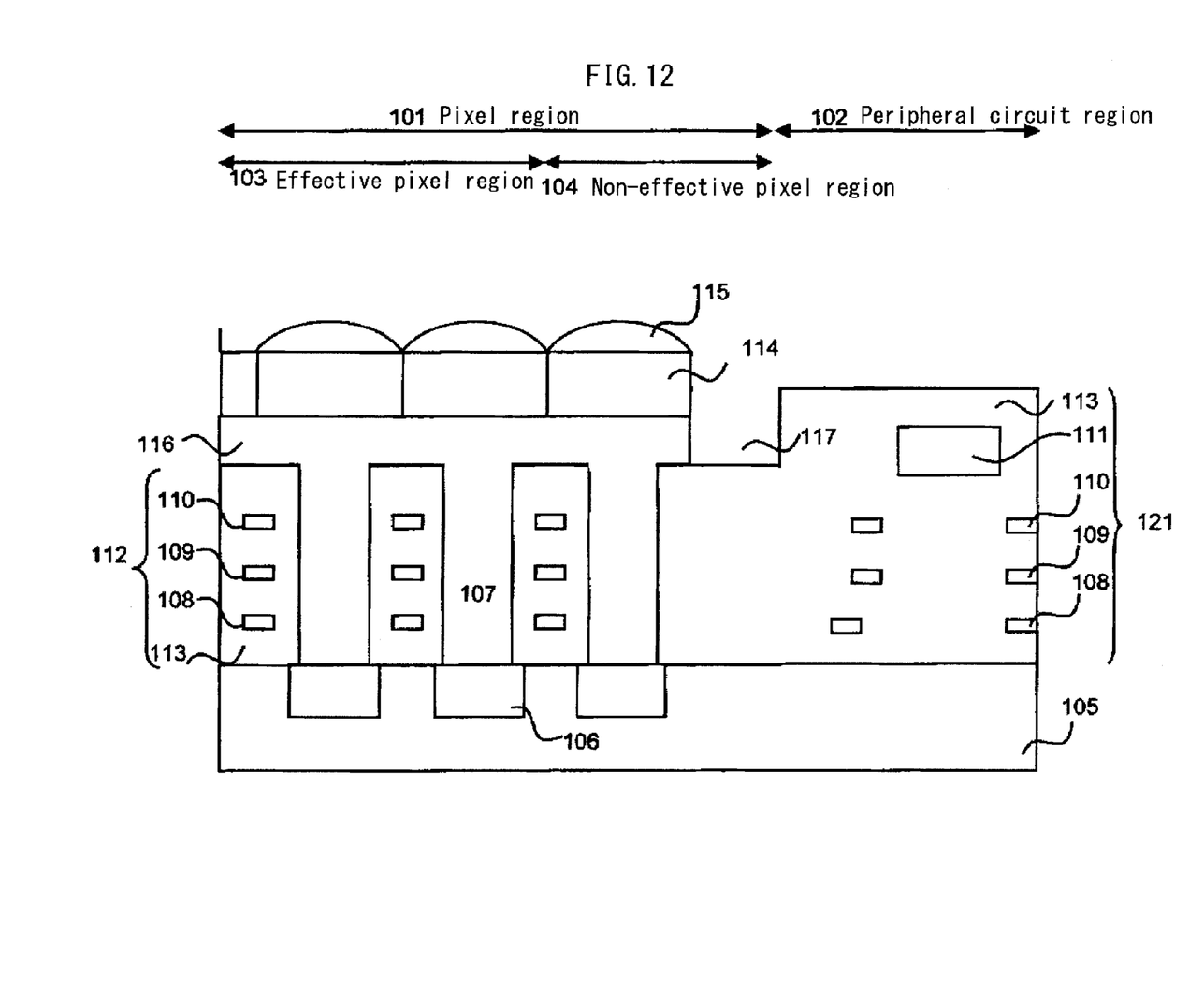
FIG. 12 is a cross-sectional view showing one step in the manufacturing method of the solid-state imaging device pertaining to the embodiment.

Subsequently, description is made on the forming of the lens film with reference to the accompanying FIG. 12. A lens is formed for each pixel by applying a lens material on the color filter film formed in the step depicted in FIG. 11, and by performing exposure and development. As detailed description as been made in the above, the color filter film within the effective pixel region 103 is formed to have a uniform thickness, by the provision of the groove 117. Hence, when the lens material is applied to the color filter film, the lens film is similarly formed to have a uniform thickness. A lens 115 having a spherical surface is formed by the lens film undergoing the steps of exposure and development, and further being heated at a temperature of 150° C. to 300° C. inclusive.

By forming the groove 117 in the pixel region 101 in an area that is adjacent to the peripheral circuit region 102 in the aforementioned method, the color filter film 114 and the lens film 115 are formed to be flat within the pixel region 101. Thus, the unevenness in sensitivity and color production of the solid-state imaging device is reduced.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

Figure 14:
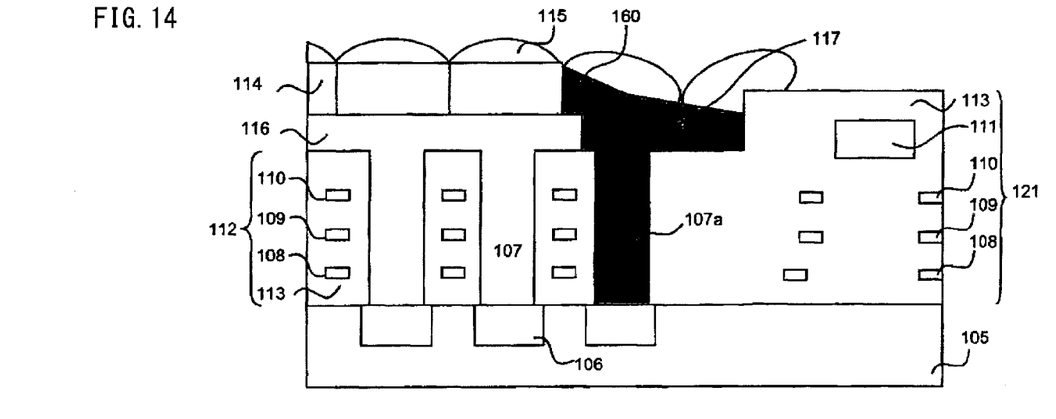
FIG. 14 is a cross-sectional view showing one step in the manufacturing method of the solid-state imaging device pertaining to the embodiment.

For instance, in the examples illustrated in FIGS. 2 and 10, the groove 117 is formed on the multilayer wiring layer 121. However, the present invention is not limited to this. The groove 117 may be formed to cover a greater area than compared to such examples. More specifically, the groove 117 may be formed to extend over a concave 107a which corresponds to a waveguide located closest to the peripheral circuit region 102, as illustrated in FIG. 14. By disposing the groove 117 to cover a greater area as such, the concave 107a located closest to the peripheral circuit region 102 is included in the groove 117, and therefore a more excessive amount of color filter film material may be absorbed by the groove 117.

In addition, a positive photosensitive resin is referred to as one example of the material with which the waveguide member 116 is formed. However, the present invention is not limited to this, and a negative photosensitive resin may be used to form the waveguide member 116.

INDUSTRIAL APPLICABILITY

The present invention provides a solid-state imaging device which is applicable in a CCD sensor, an MOS sensor, a digital still camera and the like, and which contributes to the downsizing of such devices as well as to the enhancement of imaging quality.

REFERENCE SIGNS LIST 101. pixel region
102. peripheral circuit region
103. effective pixel region
104. non-effective pixel region
105. silicon substrate
106. photodiodes
107. waveguides
107a. concave
108. wiring
109. wiring
110. wiring
111. wiring
112. multilayer wiring layer
113. interlayer film
114. color filter (color filter film)
115. lens (lens film)
116. waveguide member
117. groove
118. color filter
119. color filter
120. color filter
121. multilayer wiring layer
122. groove (groove width)
123. groove (groove width)

124. groove (groove width)
125. groove (groove width)
126. groove (groove portion)
127. groove (groove portion)
128. groove (groove portion)
129. groove (groove portion)
150. level difference
150a. side wall

What is claimed is:

1. A solid-state imaging device comprising:
a semiconductor substrate having a pixel region and a peripheral circuit region, the peripheral circuit region being in a periphery of the pixel region and configured to perform drive control of the pixel region and imaging signal processing, a plurality of unit pixels, each including a photoelectric conversion element and a gate element, being disposed in a two-dimensional array within the pixel region;
a multilayer wiring layer including layers of wiring and an interlayer film interposed therebetween, and disposed above the semiconductor substrate to cover the pixel region and the peripheral circuit region except areas above the photoelectric conversion elements;
a waveguide member filling the areas above the photoelectric conversion elements and covering the multilayer wiring layer at least within the pixel region such that, in each of the areas above the photoelectric conversion elements, a waveguide is formed by the waveguide member and the interlayer film, the waveguide being an optical path for guiding incident light therethrough to the corresponding photoelectric conversion element; and
an optical structure that is composed of a color filter material and a lens material and that is disposed above the waveguide member within the pixel region, wherein
a groove is formed by a portion of the waveguide member covering the multilayer wiring layer being removed from an area within the pixel region along a border between the pixel region and the peripheral circuit region.

2. The solid-state imaging device of claim 1, wherein the waveguide member is composed of a material having a higher refraction index than a material composing the interlayer film.

3. The solid-state imaging device of claim 1, wherein the waveguide member is composed of a material that (i) contains a photosensitive group which reacts to light exposure and (ii) is soluble in a developing solution when exposed to light, either in a portion thereof which has been exposed to light or in a portion thereof which has not been exposed to light.

4. The solid-state imaging device of claim 1, wherein the waveguide member is composed of a material that is processable by performing etching or ashing thereon.

5. The solid-state imaging device of claim 1, wherein the top surface of the multilayer wiring layer within the pixel region is lower in height compared to the top surface thereof within the peripheral circuit region.

6. The solid-state imaging device of claim 1, wherein the width of the groove is within a range of 5 nm to 100 μm, and the depth thereof is within a range of 5 nm to 10 μm.

7. The solid-state imaging device of claim 1 further comprising:
a film of material for application that covers the waveguide member.

8. The solid-state imaging device of claim 1, wherein the waveguide member is composed of at least one selected from the group consisting of a color filter material, a lens material, and a flattening material.

9. A manufacturing method for a solid-state imaging element comprising:
a first step of providing a pixel region and a peripheral circuit region on a semiconductor substrate, the pixel region including a plurality of unit pixels, each including a photoelectric conversion element and a gate element, and disposed in a two-dimensional array, the peripheral circuit region provided in a periphery of the pixel region and configured to perform drive control of the pixel region and imaging signal processing;
a second step of disposing, above the semiconductor element, a multilayer wiring layer including layers of wiring and an interlayer film interposed therebetween, so as to cover the pixel region and the peripheral circuit region except areas above the photoelectric conversion elements;
a third step of disposing a waveguide member to fill the areas above the photoelectric conversion elements and to cover the multilayer wiring layer at least within the pixel region such that, in each of the areas above the photoelectric conversion elements, a waveguide is formed by the waveguide member and the interlayer film, the waveguide being an optical path for guiding incident light therethrough to a corresponding photoelectric conversion element; and
a fourth step of forming an optical structure that is composed of a color filter material and a lens material above the waveguide member within the pixel region, wherein the manufacturing method further comprises:
a step of forming a groove by removing a portion of the waveguide member covering the multilayer wiring layer from an area within the pixel region along a border between the pixel region and the peripheral circuit region, the groove forming step performed concurrently with or subsequent to the third step, and prior to the fourth step.

10. The manufacturing method of claim 9, wherein in the third step, the waveguide member is formed by using a material having a higher refraction index than a material composing the interlayer film.

11. The manufacturing method of claim 9, wherein in the third step, the waveguide member is formed by using a material that (i) contains a photosensitive group which reacts to light exposure and (ii) is soluble in a developing solution when exposed to light, either in a portion thereof which has been exposed to light or in a portion thereof which has not been exposed to light.

12. The manufacturing method of claim 9, wherein in the third step, the waveguide member is formed by using a material that is processable by performing etching or ashing thereon.

13. The manufacturing method of claim 9, wherein in the second step, the multilayer wiring layer is formed such that the top surface thereof within the pixel region is lower in height compared to an upper surface thereof within the peripheral circuit region.

14. The manufacturing method of claim 9, wherein in the groove forming step, the groove is formed such that the width thereof is within a range of 5 nm to 100 μm, and the depth thereof is within a range of 5 nm to 10 μm.

15. The manufacturing method of claim 9, further comprising:
a step of forming, by application of material, a film that covers the waveguide member.

* * * * *